United States Patent [19]

Schröder et al.

[11] Patent Number: 5,637,867
[45] Date of Patent: Jun. 10, 1997

[54] DEVICE FOR THE OPTICAL SCANNING OF A RECORDING MEDIUM, ESPECIALLY A PHOSPHOR STORAGE PLATE

[75] Inventors: Rasmus Schröder, Heidelberg-Ziegelhausen; Christoph Burmester, Heidelberg, both of Germany

[73] Assignee: Max-Planck-Gesellschaft zur Forderung der Wissenschaften e.V., Munich, Germany

[21] Appl. No.: 325,349

[22] PCT Filed: Apr. 26, 1993

[86] PCT No.: PCT/EP93/01006

§ 371 Date: Mar. 27, 1995

§ 102(e) Date: Mar. 27, 1995

[87] PCT Pub. No.: WO93/22764

PCT Pub. Date: Nov. 11, 1993

[30] Foreign Application Priority Data

Apr. 24, 1992 [DE] Germany .......................... 42 13 556.7

[51] Int. Cl.⁶ ............................ G01N 21/00; G03B 42/00
[52] U.S. Cl. ...................... 250/234; 250/216; 250/484.4; 250/484.5
[58] Field of Search ............................ 250/234, 235, 250/236, 216, 458.1, 459.1, 372, 472.1, 475.2, 483.1, 484.2, 484.4, 484.5; 356/73, 317, 318

[56] References Cited

U.S. PATENT DOCUMENTS

| | | | |
|---|---|---|---|
| 4,188,543 | 2/1980 | Brunsting et al. ........................ | 356/318 |
| 4,189,236 | 2/1980 | Hogg et al. ........................... | 356/317 |
| 4,528,445 | 7/1985 | Willmore et al. .. | |
| 4,871,249 | 10/1989 | Watson ..................... | 356/73 |
| 5,017,781 | 5/1991 | Lang et al. ................ | 250/586 |
| 5,081,363 | 1/1992 | Tetzlaff et al. ................ | 250/484.5 |

FOREIGN PATENT DOCUMENTS

| | | |
|---|---|---|
| 0168838 | 1/1986 | European Pat. Off. . |
| 2619232 | 11/1976 | Germany . |
| 8501818 | 4/1985 | WIPO . |

OTHER PUBLICATIONS

Electron Microscopy 1986. Proceedings of the XIth Int. Cong. on Electron Microscopy. 7 Sep. 1986, Kyoto, JP, vol. 1, pp. 29–34.

Mori et al., "Development of the Imaging Plate for the Transmission Electron Microscope and Its Characteristics." J Electron Microsc 39:433–436 (1990).

Schröder, Gottfried, "Technische Optik." Vogel–Verlag, Würzburg, 1974.

*Primary Examiner*—Edward P. Westin
*Assistant Examiner*—John R. Lee
*Attorney, Agent, or Firm*—William H. Murray; Robert E. Rosenthal

[57] ABSTRACT

Device for the optical scanning of a recording medium, especially a phosphor storage plate (12), with a scanning head (10) which can move in relation to the recording medium and contains an imaging system in the form of an extended rotation-ellipsoidal mirror (14). The ellipsoidal mirror (14) has an inlet aperture (16) and an outlet aperture (18) at opposite ends. A scanning laser beam (30) impinges obliquely on the storage plate (12) moving past the inlet aperture (16). A reverse-tapering chamber (20) and a photodetector (24) are connected to the outlet aperture (18).

15 Claims, 1 Drawing Sheet

DEVICE FOR THE OPTICAL SCANNING OF A RECORDING MEDIUM, ESPECIALLY A PHOSPHOR STORAGE PLATE

TECHNICAL FIELD

The present invention relates to a device for the optical scanning of a recording medium, especially a phosphor storage plate, with a scanning head which can move in relation to the recording medium and contains a scanning beam path along which a scanning beam impinges on a prescribed scanning location past which the recording medium is movable by the relative movement, and a mirror-optical imaging system which focuses the useful radiation produced by the scanning beam at the scanning location substantially in an imaging plane, together with a photo-detector arranged in the path of the useful radiation spaced behind the imaging plane, which are known from a publication by Mori et al., J. Electron. Miscrosc. 39; 433–436 (1990).

BACKGROUND OF THE INVENTION

The device ("IP reading device") known from the aforementioned publication contains an He-Ne laser for producing a scanning beam which along a scanning beam path through a partially transparent mirror impinges on a deflecting mirror and is then focussed by a lens on a scanning location, past which the phosphor storage plate is moved by a coordinate table. The scanning beam produces at the point of the phosphor storage plate housing the scanning location a fluorescent radiation representing the stored information which following collimation by the focussing lens is reflected by the deflection mirror and by the partially transparent mirror and is focussed by a second lens in the aperture of a diaphragm, downstream of which a photomultiplier is arranged. The diaphragm is necessary to laterally distinguish the luminescence signal from the storage plate, thus increasing the resolution of the reading system.

Due to the relatively limited aperture of the focussing lens and the optical losses caused by the lenses and mirrors in the beam path of the reading beam and lastly due to the diaphragm itself, only a relatively small proportion of the fluorescent radiation arrives at the photomultiplier so that the ratio of the wanted signal to the unwanted signal at the output of the photomultiplier needs to be improved.

SUMMARY OF THE INVENTION

On the basis of this prior art the present invention is based on the object of defining a device for the optical scanning of a recording medium, especially a phosphor storage plate, with a scanning head which can move in relation to the recording medium and contains a scanning beam path along which a scanning beam impinges on a prescribed scanning location past which the recording medium is movable by the relative movement, and a mirror-optical imaging system which focuses the useful radiation produced by the scanning beam at the scanning location substantially in an imaging plane, together with a photo-detector arranged in the path of the useful radiation spaced behind the imaging plane, in which a substantially greater proportion of the useful radiation generated by the scanning beam at the scanning location may be detected by the photodetector whilst simultaneously achieving a very high lateral localized resolution.

This object is achieved by the device as characterized in claim 1. Further developments and advantageous embodiments of this device according to the invention are the subject matter of sub-claims.

The present invention is chariatized by a substantially confocal optical system of mirrors of a very high aperture which detects a very large proportion of the useful radiation generated in reading and passes it on to the photodetector practically loss-free. Due to the imaging property of the mirror system the laser radiation reflected or backscattered by the inlet window of the photodetector (SEV) or by a colored glass filter upstream of the latter may be absorbed in a further concave mirror designed as a beam trap, at the output of the system of mirrors forming the actual imaging system. Sensitivity and resolution are high.

In one preferred device for scanning the information stored in a phosphor storage plate a laser scanning beam is used, the intensity of which is substantially higher than that of the laser reading beam of known phosphor storage plate reading devices. For instance a He-Ne laser having a CW power of more than 10 mW, particularly more than 15 mW, may be used. This high power is sensibly employable for the first time by the imaging property of the mirror system very strongly suppressing the laser light reflected or backscattered from the color filter and/or the inlet. window of the photodetector on to the storage plate.

The device according to the invention is especially suitable for optically scanning phosphor storage plates and will thus be described in the following on the basis of this application. However, the invention is not limited to reading devices for phosphor storage plates, it also permitting use for reading other recording media in which information is stored in an optically readable form.

BRIEF DESCRIPTION OF THE DRAWING

In the following the invention is explained in more detail on the basis of a preferred example embodiment with reference to the drawing, the sole Figure of which shows an axial section through the parts substantial to the invention of a device for optically scanning a phosphor storage plate.

DETAILED DESCRIPTION

Figure 1:
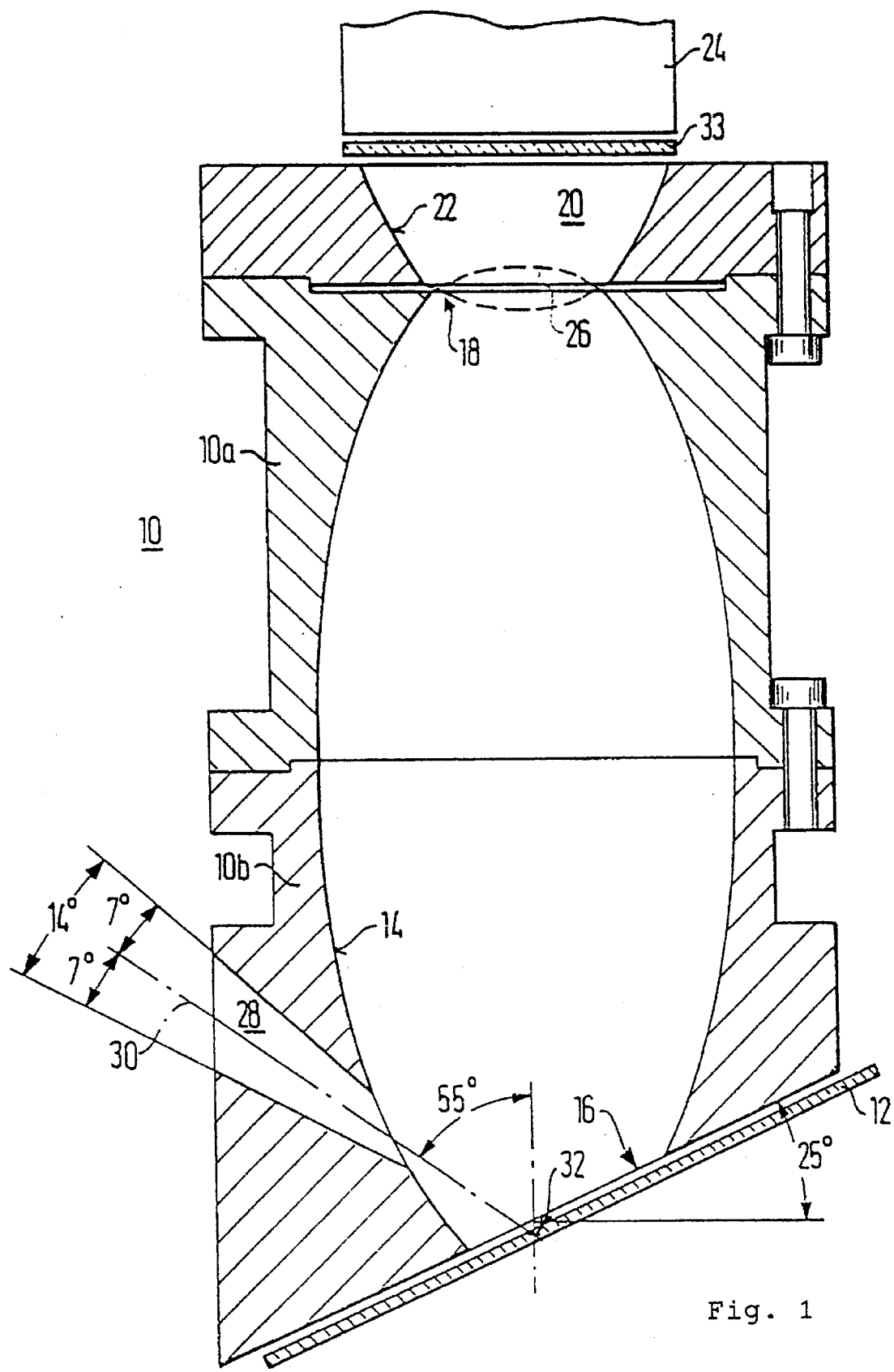

The drawing substantially illustrates in axial section the optical system of a scanning head 10 serving for optically scanning a phosphor storage plate 12. The scanning head 10 is shiftable with respect to the storage plate 12, e.g. by one of the two members being fixedly mounted and the other being connected to a suitable drive such as a stepper motor controlled coordinate drive (not shown).

The sampling head 10 comprises two hollow parts 10a, 10b screwed together to form within a chamber having the shape of an extended, i.e. elongated rotational ellipsoid mirror which in the illustrated example embodiment has a small half-axis of 20 mm and a large half-axis of approx. 48 mm. The inner wall of the chamber forms an ellipsoidal mirror 14. The end of the ellipsoid facing the storage plate 12 is cut off obliquely at an angle of 25 degrees to the longitudinal axis of the ellipsoid to form an inlet aperture 16 through which the useful radiation resulting from reading the storage plate, i.e. in this case fluorescent radiation, is able to enter the chamber defined by the mirror 14. The storage plate 12 is mounted parallel to the plane of the inlet aperture 16 thereby.

The upper end of the chamber is cut off straight to form an outlet aperture 18 for the useful radiation. The outlet aperture 18 is followed by a reverse-tapering, i.e. outwardly flared chamber 20 having a reflective inner wall 22 at the aperture of which opposite the outlet aperture 18 a photo-multiplier (SEV) 24 is arranged serving as the photodetector.

Between the outlet aperture 18 and the chamber 20 a diaphragm may be arranged which laterally discriminates the useful radiation, i.e. in this case a blue fluorescent radiation, and thus increases the localized resolution. Between the photomultiplier 24 and the chamber 20 a colored glass filter 33 is arranged which transmits only the useful radiation, i.e. the blue luminescent light whilst absorbing the red laser radiation and/or reflecting it into the chamber, it thereby blocking the scanning radiation, in this case the red laser radiation.

In the lower part 10b of the scanning head 10 a passage 28 slightly flared conically outwards is provided for a scanning beam 30. In this case the passage has an angle of aperture of 14 degrees and the beam path of the scanning beam 30 forms an angle of 55 degrees with the longitudinal axis of the ellipsoid so that the scanning beam is not incident excessively inclined on the surface of the storage plate which for this reason too, is arranged at an angle to the longitudinal axis of the mirror 14.

In the example embodiment shown, the inlet aperture 16 has a diameter of 21 mm, the outlet aperture 18 a diameter of 16.5 mm, the component forming the chamber 20 has an axial dimension of 12 mm and an aperture facing the photomultiplier has a diameter of approx. 29.5 mm. It will be appreciated that these and the aforementioned parameters, dimensions and angles are, of course, not to be deemed as being restrictive.

In operation the reading of scanning beam 30 produced by the He-Ne laser (not shown) is incident at a scanning location 32 on the phosphor plate 12 where it causes a fluorescent radiation which is generally blue in color, the intensity of which depends on the information stored at the corresponding location. This useful radiation is substantially totally collimated by the optical mirror system due to the very high aperture of the mirror system which in actual practice exceeds 0.9 and focussed in the middle of the plane of the outlet aperture 18. Undesirable scattered radiation caused by scattering of the scanning beam in the multicrystalline phosphor storage plate 12 is absorbed by the color filter 26 and/or diminished by multiple reflection in the chamber 20 to such an extent that the scattered radiation attains the ellipsoidal chamber only very strongly attenuated and thus no laser intensity is affecting the storage plate outside of the location 32, thus resulting in a useful signal, i.e. fluorescent radiation being generated only at the location 32, thereby increasing the resolution of the reading system.

The described elongated ellipsoidal mirror 14 represents an optimum realization of the confocal mirror imaging system used in this case. Since apart from the color filter 26, which is not required in many cases, and the light incident surface area of the photomultiplier 24 no boundary surface areas need to be passed by fluorescent light, the optical losses are minimal.

Instead of the described rotation-ellipsoidal mirror other mirror systems may be employed, however, such as a mirror having the shape of a triaxial ellipsoid, furthermore two rotational paraboloids, the major apertures of which face each other, or also other mirror systems which at least approximately result in a confocal image of the scanning location 32 in the relatively large outlet aperture 18.

The inner wall 22 of the cavity 20 may take the form of part of a rotation-ellipsoid, it merely being essential, however, that it is slightly flared from the outlet aperture 18. The axial length of the chamber 20 is generally smaller than the diameter of the outlet aperture 18 which in turn is generally smaller than the diameter of inlet aperture 16.

The surface areas 14 and 22 may be produced by a diamond lathe tool.

Since in the present confocal imaging system, despite its very large aperture, the reflected radiation of the unwanted signal (in this case the laser radiation reflected into the ellipsoidal mirror system by the storage plate and the color filter or multiplier) is strongly attenuated by the chamber 20, use may be made of a scanning beam 30 in the present invention which has a substantially higher intensity than in known devices in the field concerned. In one practical embodiment of the invention a He-Ne laser beam having a power of 16 mW was used. The increase in the power of the scanning beam has the substantial advantage that the color centers are practically completely cancelled by scanning so that the already scanned areas of the storage plate can also no longer be caused by scattered scanning radiation to emit unwanted florescence which would detriment the resolution.

What is claimed is:

1. A device for the optical scanning of a recording medium, comprising (a) a scanning head movable in relation to the recording medium and comprising (i) a scanning beam path along which a scanning beam may be transmitted to impinge on a prescribed scanning location, and (ii) a mirror-optical imaging system which focusses radiation produced by said scanning beam at the scanning location substantially in an imaging plane, and (b) a photodetector arranged in the path of the radiation produced by the scanning beam at the scanning location spaced behind the imaging plane, wherein said imaging system comprises a chamber having a light inlet aperture for receiving the radiation produced by the scanning beam at the scanning location, a light outlet aperture axially opposed to said light inlet aperture, and a reflecting inner surface defining a mirror adapted to provide a confocal image of the scanning location at said outlet aperture.

2. The device as set forth in claim 1, wherein said chamber has the shape of a rotation-ellipsoid.

3. The device as set forth in claim 1, wherein said chamber has a longitudinal axis and said inlet aperture lies in a plane oriented obliquely to the longitudinal axis of said chamber.

4. The device as set forth in claim 1, wherein said chamber has a longitudinal axis and said scanning beam path comprises an aperture in said scanning head oriented obliquely to the longitudinal axis of said chamber.

5. The device as set forth in claim 1, further comprising, between said outlet aperture of said chamber and said photodetector, an outlet chamber reverse-tapering in the propagation direction of the radiation produced by said scanning beam at the scanning location.

6. The device as set forth in claim 5, wherein said outlet chamber has walls and the walls of said outlet chamber are concave cross-sectionally.

7. The device as set forth in claim 5, wherein said outlet chamber has a wall and said wall of said outlet chamber is a reflecting wall.

8. The device as set forth in claim 1, wherein said chamber has a longitudinal axis and said scanning beam path is oriented obliquely to the longitudinal axis of said chamber.

9. A method for optical scanning of a recording medium, comprising the steps of:
(a) causing a scanning beam to impinge on a prescribed scanning location on the recording medium;
(b) providing a scanning head comprising a chamber, said chamber having a longitudinal axis, a light inlet aperture, a light outlet aperture axially opposed to said light inlet aperture, and a reflecting inner surface defining a mirror adapted to provide a confocal image of the scanning location at the outlet aperture; and
(c) receiving at said light inlet aperture radiation produced by the scanning beam at the scanning location, and providing a focal image of the scanning location at said outlet aperture.

10. The method of claim 9, wherein said step of providing a scanning head further comprises a step of providing said chamber in the form of a rotation-ellipsoid.

11. The method of claim 9, wherein said inlet aperture lies in a plane obliquely to the longitudinal axis of said chamber.

12. The method of claim 9, wherein said step of causing a scanning beam to impinge on the recording medium comprises the step of providing a scanning beam path aperture defined in said scanning head and oriented obliquely to the longitudinal axis of said chamber.

13. The method of claim 9, further comprising the step of providing an outlet chamber, reverse-tapered in the propagation direction of the radiation produced by said scanning beam at the scanning location, exterior to said outlet aperture of said chamber, said outlet chamber having walls.

14. The method of claim 13, wherein the walls of said outlet chamber are concave cross-sectionally.

15. The method of claim 9, wherein the step of causing the scanning beam to impinge on the recording medium comprises providing the scanning beam oriented obliquely to the longitudinal axis of said chamber, and further comprising the step of mounting the recording medium inclined to the scanning beam path and to the longitudinal axis of said chamber.

* * * * *